United States Patent

Locatelli et al.

(10) Patent No.: US 7,456,658 B2
(45) Date of Patent: Nov. 25, 2008

(54) CIRCUIT TO OPTIMIZE CHARGING OF BOOTSTRAP CAPACITOR WITH BOOTSTRAP DIODE EMULATOR

(75) Inventors: Christian Locatelli, Broni (IT); Andrea Francesco Merello, Arese (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/696,825

(22) Filed: Apr. 5, 2007

(65) Prior Publication Data

US 2007/0236283 A1 Oct. 11, 2007

Related U.S. Application Data

(60) Provisional application No. 60/790,406, filed on Apr. 7, 2006.

(51) Int. Cl.
*H03K 19/082* (2006.01)
*H03K 17/16* (2006.01)

(52) U.S. Cl. .............................. 326/88; 326/92; 327/390

(58) Field of Classification Search .................... 326/82, 326/83, 88, 92; 327/108–112, 390, 589
See application file for complete search history.

(56) References Cited

U.S. PATENT DOCUMENTS

| 5,138,200 | A | 8/1992 | Barsanti et al. |
| 5,369,319 | A | 11/1994 | Good et al. |
| 5,373,435 | A | 12/1994 | Jayaraman et al. |
| 5,502,632 | A | 3/1996 | Warmerdam et al. |
| 5,883,547 | A * | 3/1999 | Diazzi et al. ................. 327/589 |
| 7,215,189 | B2 | 5/2007 | Wilhelm |
| 2005/0052168 | A1 | 3/2005 | Tazawa et al. |
| 2005/0102128 | A1 | 5/2005 | Wilhelm |
| 2006/0044051 | A1 | 3/2006 | Locatelli |

* cited by examiner

*Primary Examiner*—James H. Cho
*Assistant Examiner*—Thienvu V Tran
(74) *Attorney, Agent, or Firm*—Ostrolenk, Faber, Gerb & Soffen, LLP

(57) ABSTRACT

A circuit for optimizing charging of a bootstrap capacitor connected to a high side floating supply voltage at a first terminal and to a switched node voltage at a second terminal, the circuit for optimizing being included in a gate driver circuit having a high-and a low-side driver circuits for driving high- and low-side switches connected at a switched node in a half bridge to provide current to a load, the high-side driver circuit receiving a first control voltage referenced to a first level and a low-side driver circuit receiving a second control voltage referenced to a second level, the bootstrap capacitor providing supply voltage for the high-side driver circuit. The optimizing circuit includes a first switch connected to the first terminal of the bootstrap capacitor; and a phase sense comparator for sensing the voltage at the switched node and turning ON the first switch when the voltage at the switched node is LOW, whereby charging of the bootstrap capacitor is optimized when the phase sense comparator is enabled.

11 Claims, 10 Drawing Sheets

BOOTSTRAP DIODE EMULATOR + PHASE SENSE COMPARATOR

VCC = LOW SIDE SUPPLY VOLTAGE
VSS = LOGIC GROUND
VS = HIGH SIDE OFFSET VOLTAGE (PHASE)
VBS = HIGH SIDE FLOATING SUPPLY VOLTAGE
LOPD = LOW SIDE OUTPUT PRE-DRIVER

BOOTSTRAP DIODE EMULATOR + PHASE SENSE COMPARATOR

BOOTSTRAP DIODE EMU + PHASE SENSE COMPARATOR

PHASE SENSE COMPARATOR BLOCK DIAGRAM

PHASE SENSE COMPARATOR FUNCTIONAL DIAGRAM

CIRCUIT TO OPTIMIZE CHARGING OF BOOTSTRAP CAPACITOR WITH BOOTSTRAP DIODE EMULATOR

CROSS-REFERENCE TO RELATED APPLICATION

This application is based on and claims priority to U.S. Provisional Patent Application Ser. No. 60/790,406, filed on Apr. 7, 2006 and entitled CIRCUIT TO OPTIMIZE CHARGING OF BOOTSTRAP CAPACITOR WITH BOOSTRAP DIODE EMULATOR, which is incorporated herein by reference. The entire contents of U.S. patent application Ser. No. 10/712,893, filed on Nov. 12, 2003 and entitled BOOTSTRAP DIODE EMULATOR WITH DYNAMIC BACK-GATE BIASING and of U.S. patent application Ser. No. 11/207,465, filed on Aug. 19, 2005 and entitled BOOTSTRAP DIODE EMULATOR WITH DYNAMIC BACK-GATE BIASING AND SHORT-CIRCUIT PROTECTION, are also incorporated herein by reference.

BACKGROUND OF THE INVENTION

The present invention relates to optimizing charging of a bootstrap capacitor wherein a bootstrap capacitor is charged by a circuit emulating a bootstrap diode.

A common half bridge gate driver circuit 100 driving a load is illustrated in FIG. 1. The gate driver circuit 100 includes a high side and a low side driver circuits DRV1 and DRV2 for driving high side and low side transistors 105a and 105b in a complementary fashion. In the illustrated circuit 100, it is necessary to provide voltage DC1 for the high side driver circuit DRV1, which is referenced to a different reference level than voltage DC2 provided for the low side driver circuit DRV2.

That is because a source of the high side transistor 105a is above a source of the low side transistor 105b. The high side driver circuit DRV1 is referenced to the source of the high side output transistor 105a. Thus the powering voltage to the high side driver circuit DRV1 must be above powering voltage to the low side driver circuit DRV2.

To do this, a bootstrap circuit, illustrated in FIG. 2, has been employed including a bootstrap capacitor CBS and a diode DBS coupled to the voltage DC2. The diode DBS allows the bootstrap capacitor CBS to be charged to a high side floating supply voltage VBS above the source voltage at a switched node A while the low side transistor 105b is conducting and the high side transistor 105a is turned OFF. When the low side transistor 105b is turned OFF, the power supply voltage to the high side driver circuit DRV1 is approximately at a level of the voltage DC2 above the source voltage at a switched node A. That is because the capacitor CBS has been charged through the diode DBS from the supply voltage DC2. Accordingly, the high side floating supply voltage VBS for the high side driver has been increased above the level of DC2 which powers the low side driver circuit DRV2 using this bootstrap circuit.

In another circuit 300, shown in FIG. 3, the bootstrap diode DBS (FIG. 2) has been replaced by a bootstrap diode emulator circuit 302, used for charging the bootstrap capacitor CBS. The advantage of circuit 300 over circuit 101 (FIG. 2) is that the losses due to the diode are reduced.

FIG. 4, illustrate the bootstrap diode emulator circuit 302. Typically, such circuit uses an FET 405 having lower forward losses than a diode. The bootstrap diode emulator circuit 302 further employs a gate control circuit 410 for accepting a low side input signal LIN and driving the FET 405 and a dynamic back-gate biasing circuit 415. The dynamic back-gate biasing circuit 415 accepts the low side input signal LIN and is connected to the low side return node B (see FIG. 3) and the bootstrap capacitor CBS. The FET 405 is also connected to the bootstrap capacitor CBS and to the low side supply voltage DC2 $V_{CC}$.

The gate control circuit 410 is shown in FIG. 5. It includes switched 520, 525, 530, 535, and 545; inverter circuits 505 and 515; and a source 510. The dynamic back-gate biasing circuit 415 is shown in FIG. 6. That circuit includes switches 620, 625, 630, and 635; two sources 610 and 615; and an inverter 605. A circuit 700 of FIG. 7 illustrates the components of the gate control circuit 410 and the dynamic back-gate biasing circuit 415 combined with the rest of the circuit 300 of FIG. 3. The circuit 700 is the subject of U.S. patent application Ser. No. 10/712,893, which is incorporated herein by reference.

The circuit 700 possesses limitations, including conditions when the bootstrap capacitor cannot be fully charged because the low side input signal LIN to the low side driver is low even though the voltage VS at the switched node A is still low. In this condition, when the low side input signal LIN is low, because the bootstrap diode emulator is off, it cannot charge the bootstrap capacitor CBS. This deficiency may cause development of insufficient voltage across the bootstrap capacitor CBS to properly power the high side driver.

SUMMARY OF THE INVENTION

It is an object of the present invention to provide a circuit that optimizes the charging of the bootstrap capacitor to allow the bootstrap capacitor to charge whenever the voltage VS at a switched node A is low.

A circuit is provided for optimizing charging of a bootstrap capacitor connected to a high side floating supply voltage at a first terminal and to a switched node voltage at a second terminal, the circuit for optimizing being included in a gate driver circuit having a high- and a low-side driver circuits for driving high- and low-side switches connected at a switched node in a half bridge to provide current to a load, the high-side driver circuit receiving a first control voltage referenced to a first level and a low-side driver circuit receiving a second control voltage referenced to a second level, the bootstrap capacitor providing a supply voltage for the high side driver circuit. The optimizing circuit includes a first switch connected to the first terminal of the bootstrap capacitor; and a phase sense comparator for sensing the voltage at the switched node and turning ON the first switch when the voltage at the switched node is LOW, whereby charging of the bootstrap capacitor is optimized when the phase sense comparator is enabled.

Other features and advantages of the present invention will become apparent from the following description of the invention that refers to the accompanying drawings.

DETAILED DESCRIPTION OF EMBODIMENTS OF THE INVENTION

Figure 1:
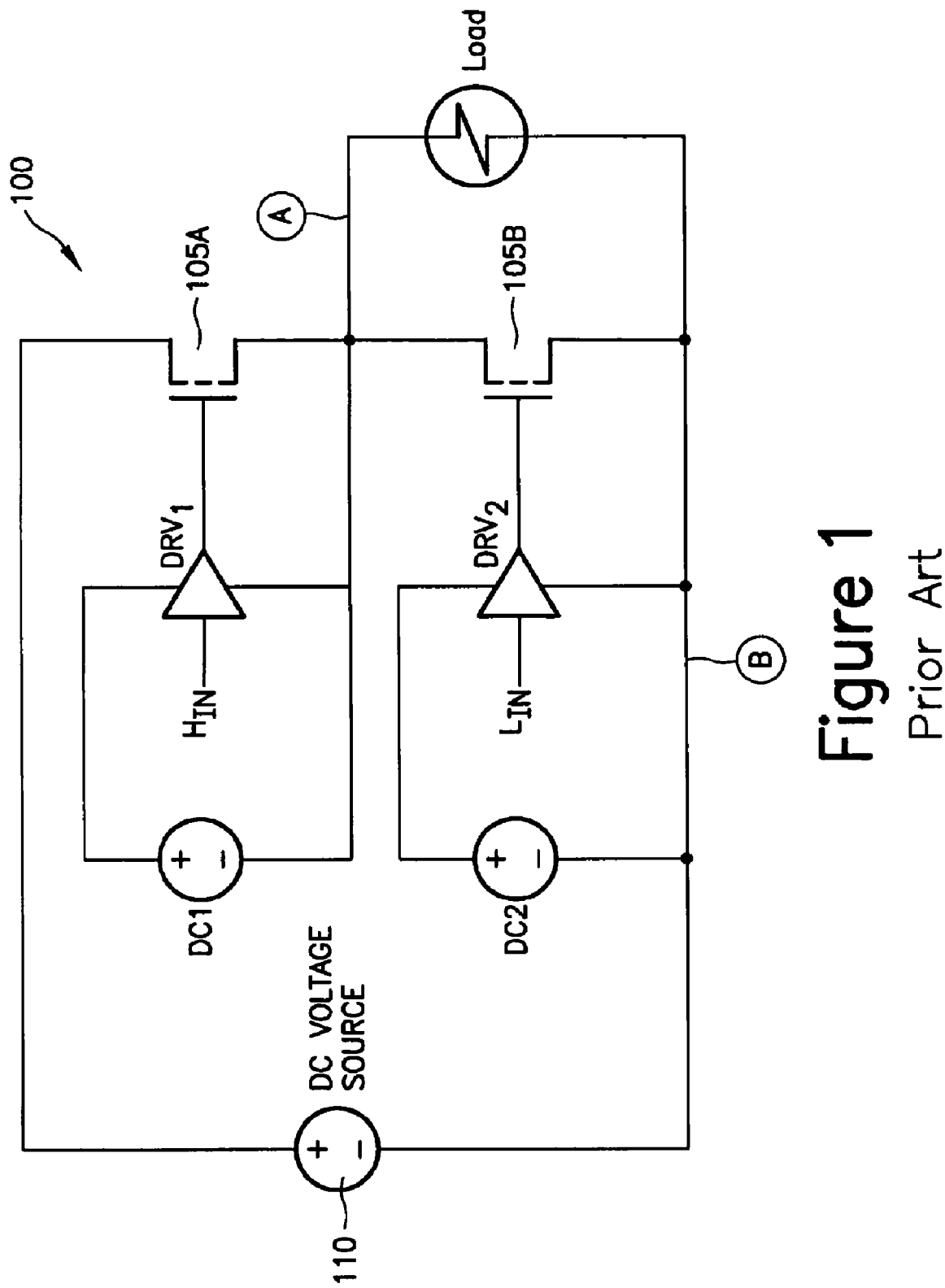
FIG. 1 is a diagram of a commonly used gate driver circuit having a half bridge stage for driving a load.
Figure 2:
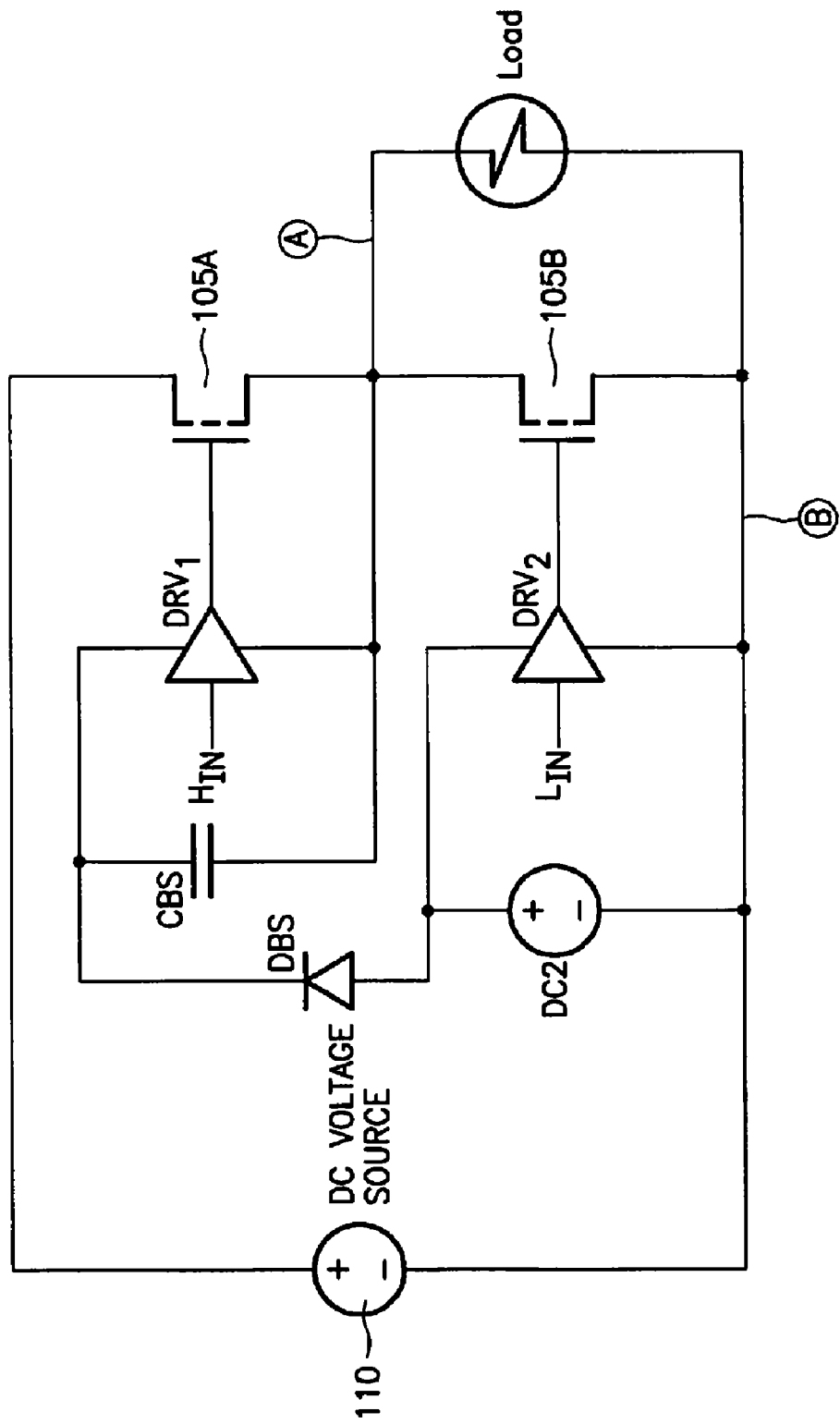
FIG. 2 is a diagram of the gate driver of FIG. 1 using a bootstrap circuit instead of a voltage source for the high side driver circuit.
Figure 3:
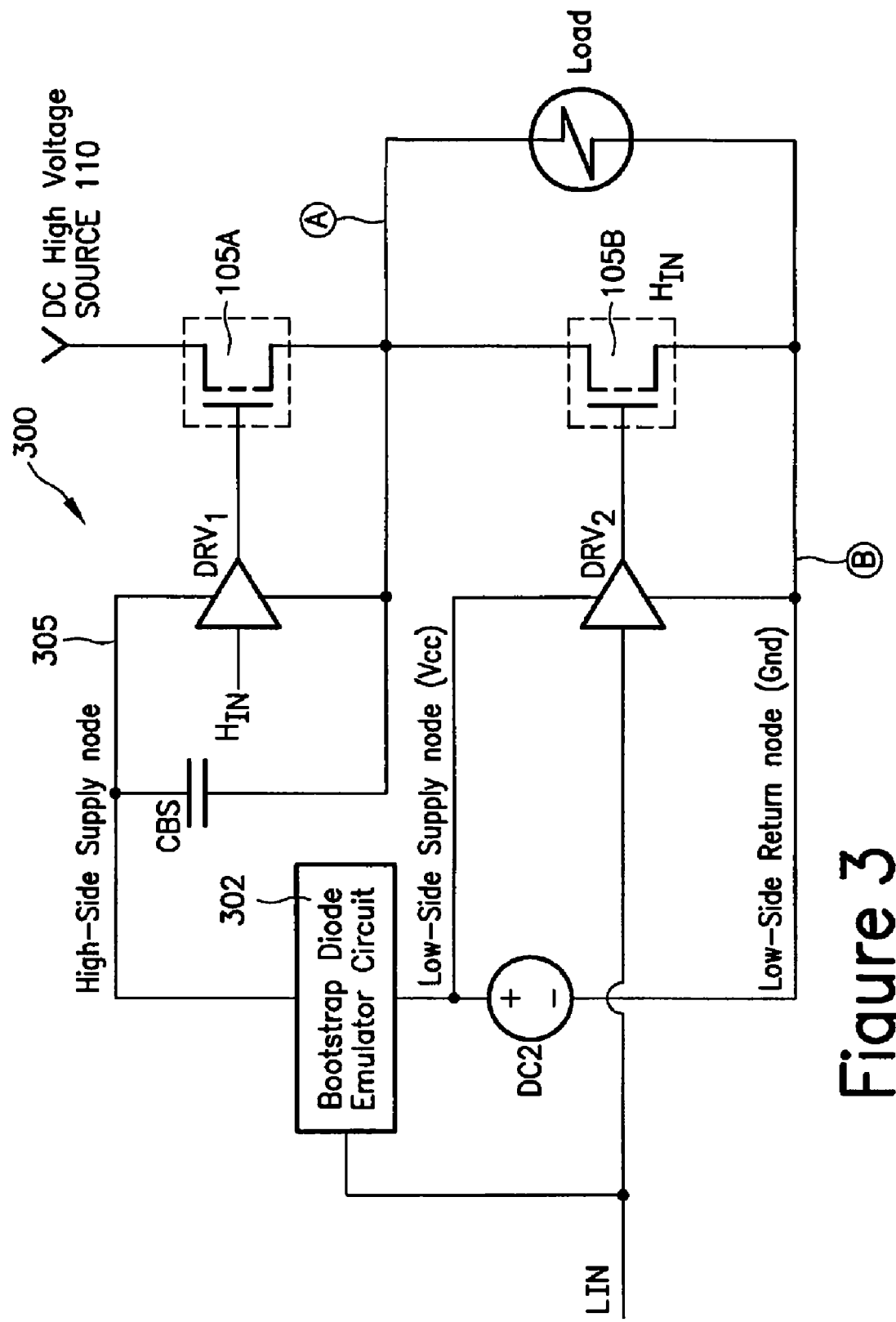
FIG. 3 is a diagram of another version of the gate driver of FIG. 2 having the bootstrap circuit using a bootstrap diode emulator circuit instead of the bootstrap diode.
Figure 4:
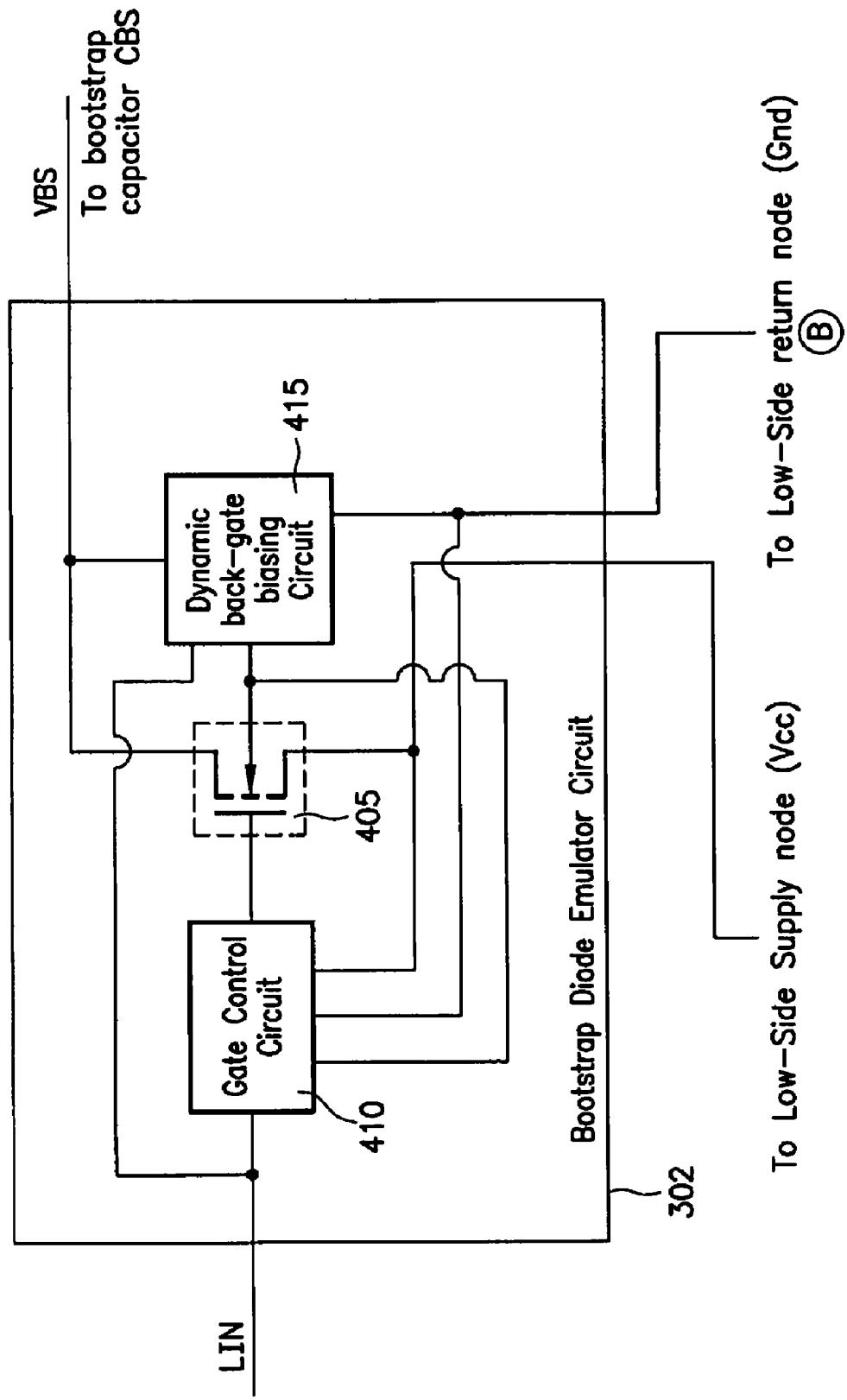
FIG. 4 is a diagram of the diode emulator circuit of FIG. 3.
Figure 5:
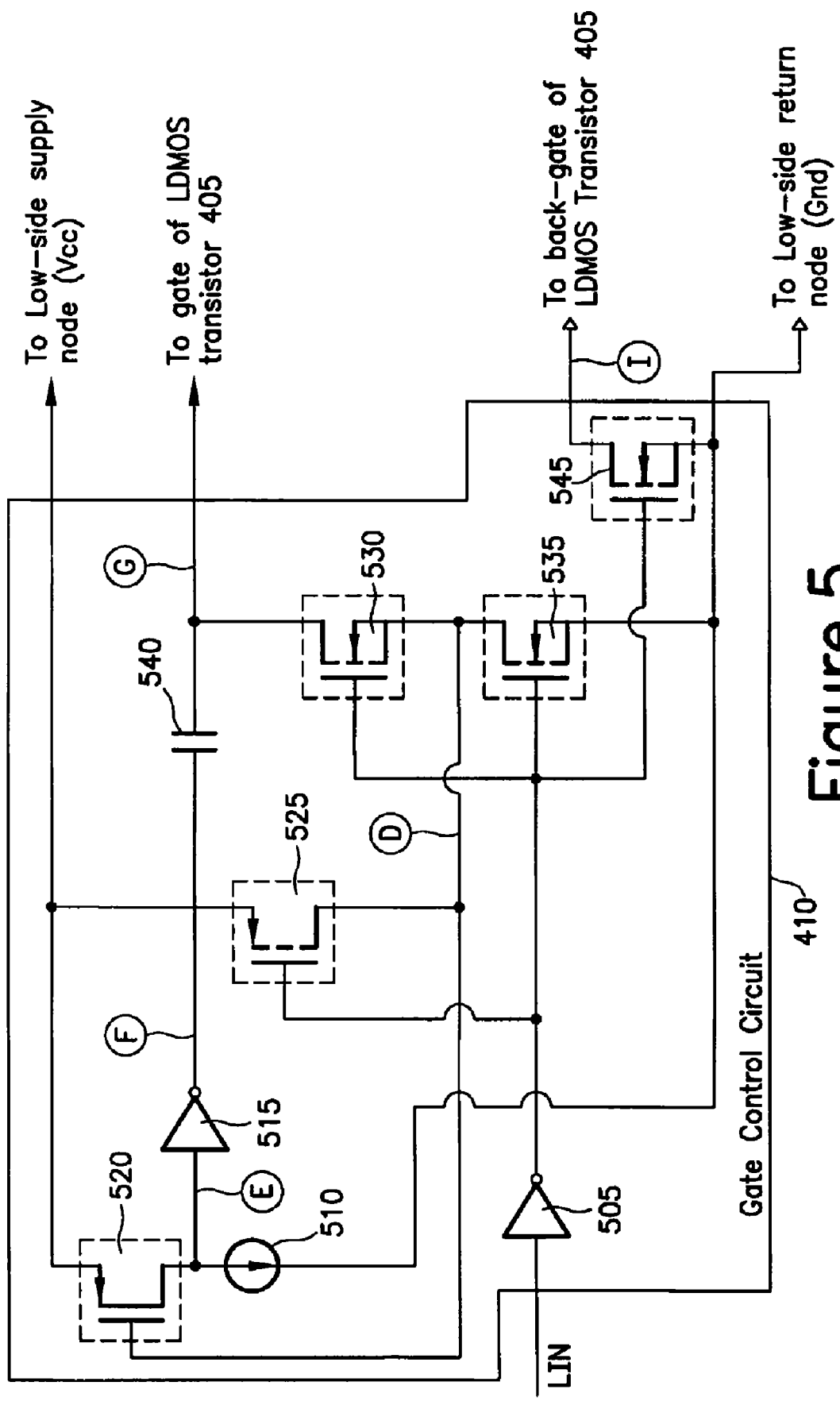
FIG. 5 is a diagram of a gate control circuit of FIG. 4.
Figure 6:
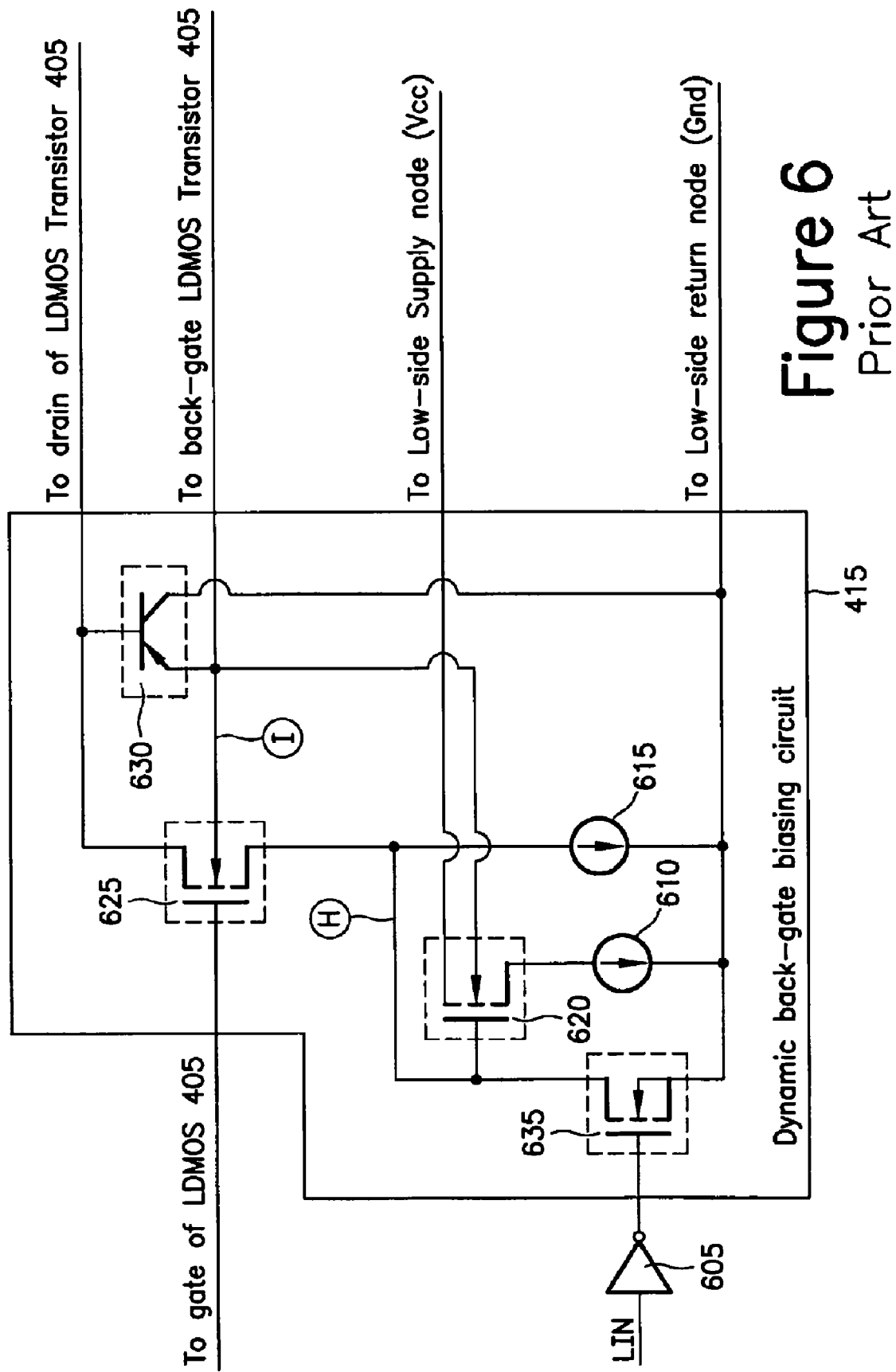
FIG. 6 is a diagram of a dynamic back-gate biasing circuit of FIG. 4.
Figure 7:
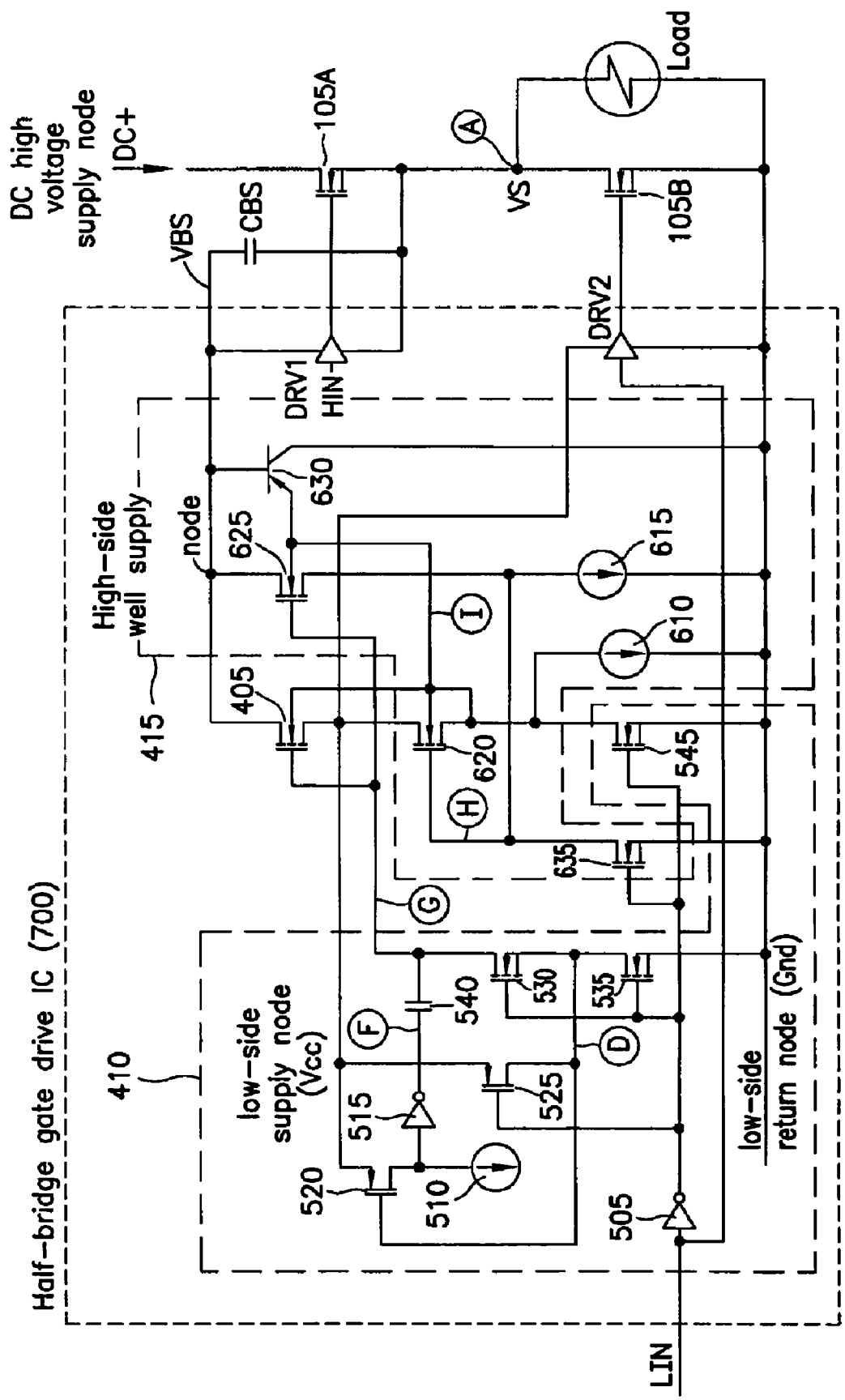
FIG. 7 is a combined diagram of circuits described in FIGS. 3-6.
Figure 8:
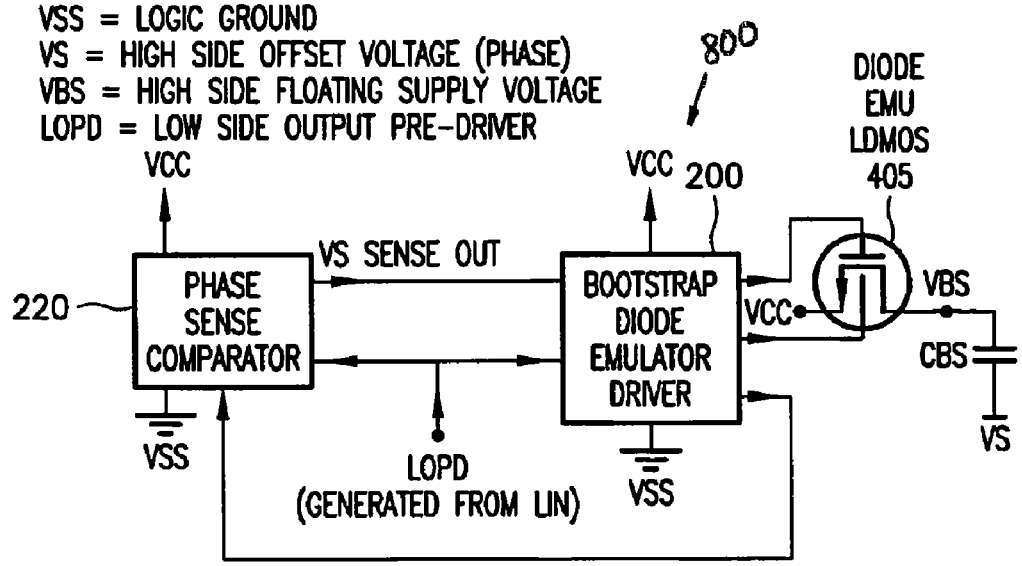
FIG. 8 is a diagram of a bootstrap diode emulator controlled by a phase sense comparator of the present invention.

In accordance with the present invention, FIG. 8 shows a circuit 800 that optimizes the charging of the bootstrap capacitor CBS to allow it to charge whenever the voltage VS at switched a node A (FIG. 7) is low. The circuit 800 includes a phase sense comparator 220, the emulator diode, illustrated by the FET 405 (also see FIG. 4), and a bootstrap diode emulator driver 200.

The phase sense comparator 220 and the bootstrap diode emulator driver 200 are connected between the low side supply voltage $V_{CC}$ and the ground $V_{SS}$. The phase sense comparator 220 receives a signal from the bootstrap diode emulator driver 200 and an enabling signal LOPD generated by a low side output pre-driver from the low side input signal LIN and provides an output VSsense out to the low side driver. The diode emulator LDMOS 405 is connected between the low side supply voltage VCC and the high side floating supply voltage VBS. The high side floating supply voltage VBS is provided across a capacitor $C_{BS}$, which is connected to the switched node (phase) VS.

According to the present invention, the high and low side input signals HIN and LIN are sensed. If the high side input signal HIN is HIGH, the phase sense comparator 220 is disabled. If the low side input signal LIN is HIGH and thus LOPD signal, generated from the low side input signal LIN, is HIGH, the phase sense comparator 220 is enabled.

When the high and low side input signals HIN or LIN go OFF, a timeout, e.g., one microsecond, is employed to keep the phase sense comparator 220 enabled. If during the timeout, the voltage VS stays OFF or goes to DC– level, the bootstrap diode emulator 405 is kept turned ON. If during the timeout, the switched node voltage VS stays at or goes to DC+, the bootstrap diode emulator 405 is turned OFF and the phase sense comparator 220 is disabled. Thus, the bootstrap diode emulator 405 is driven only by the phase sense comparator 220. The bootstrap capacitor CBS is charged whenever the phase sense comparator 220 is enabled.

The phase sense comparator 220 senses the voltage VS. At the end of the timeout, if the phase of the voltage VS is low, the phase sense comparator 220 remains enabled. If the voltage VS goes HIGH, the phase sense comparator 220 goes OFF.

Figure 9:
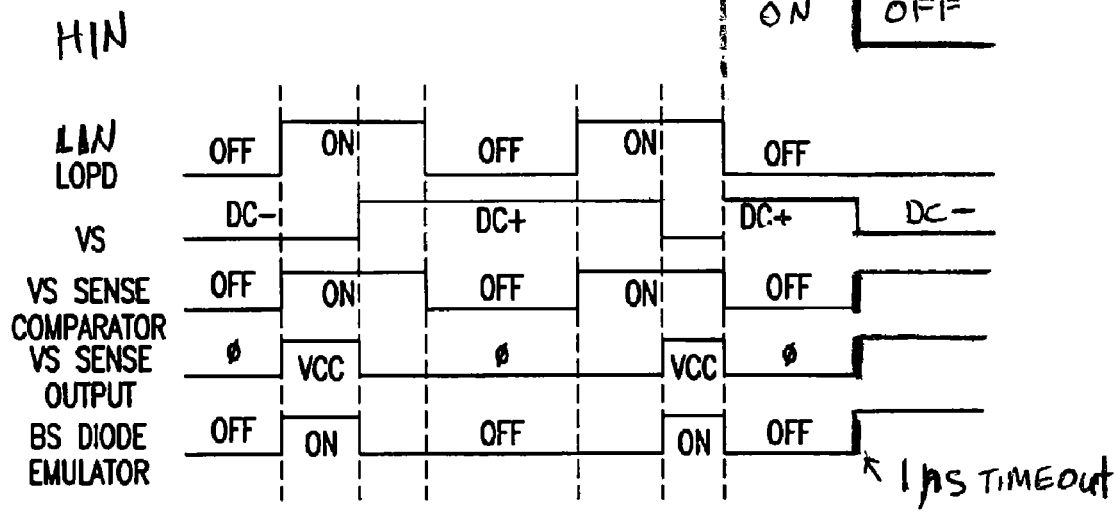
FIG. 9 is a graph indicating operational sequence of signals over time.

As shown in FIG. 9, the phase sense comparator 220 provides a high output at the voltage VS sense output when signal LOPD (LIN) is high and the high side offset voltage VS is low at DC–. There is thus a double enable. The bootstrap emulator diode 405 is turned ON by the phase sense comparator 220 if the low side driver input LIN is on and the high side offset voltage VS is low. Thus, according to the present invention, the bootstrap diode emulator 405 is turned ON every time the voltage VS at the switched node A is low, ensuring that the charging of the bootstrap capacitor CBS is optimized.

Figure 10:
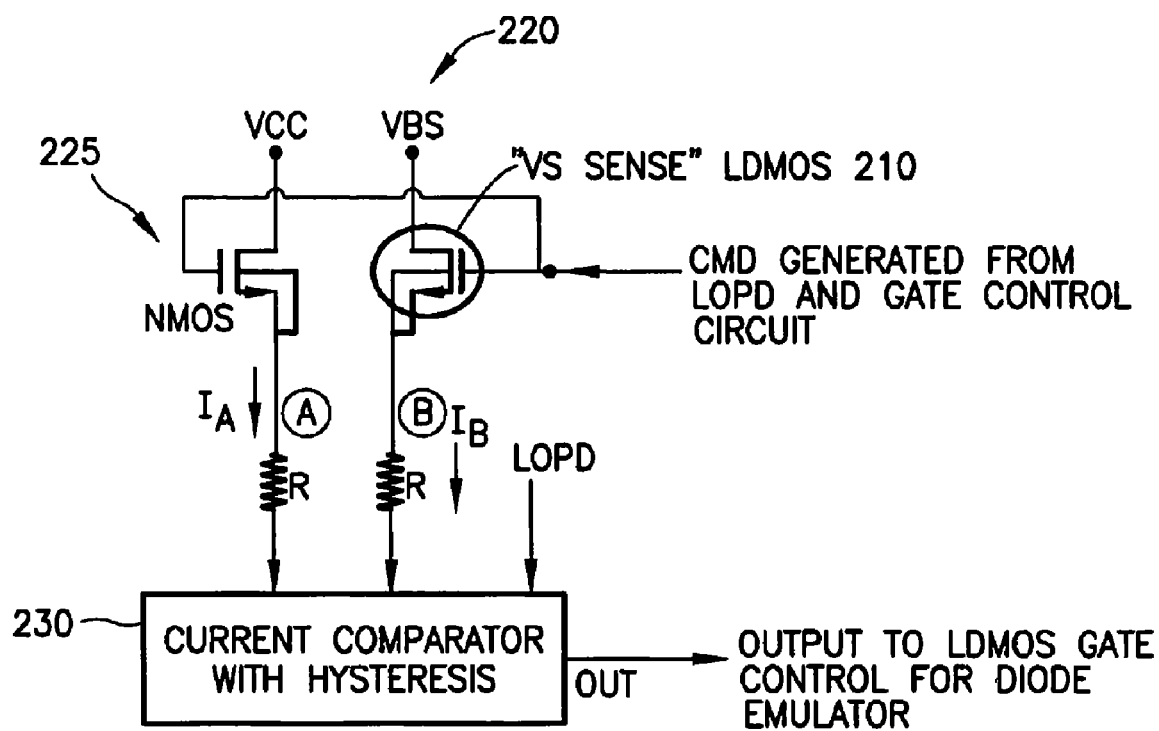
FIG. 10 is a diagram of the phase sense comparator circuit.

A circuit of the phase sense comparator circuit 220 is illustrated in FIG. 10. The circuit includes a current comparator 230 with hysteresis and two switches. The phase sense comparator circuit 220 uses an LDMOS device 210 and a low-voltage NMOS device 225 to compare the high side floating supply voltage VBS and VCC. The high side floating supply voltage VBS approximately equals the combination of the voltage VS and VCC. The respective currents $I_A$ and $I_B$ through the LDMOS device 210 and the NMOS device 225 via resistors Ra and Rb are provided to the current comparator circuit 230 having a hysteresis characteristic.

Figure 11:
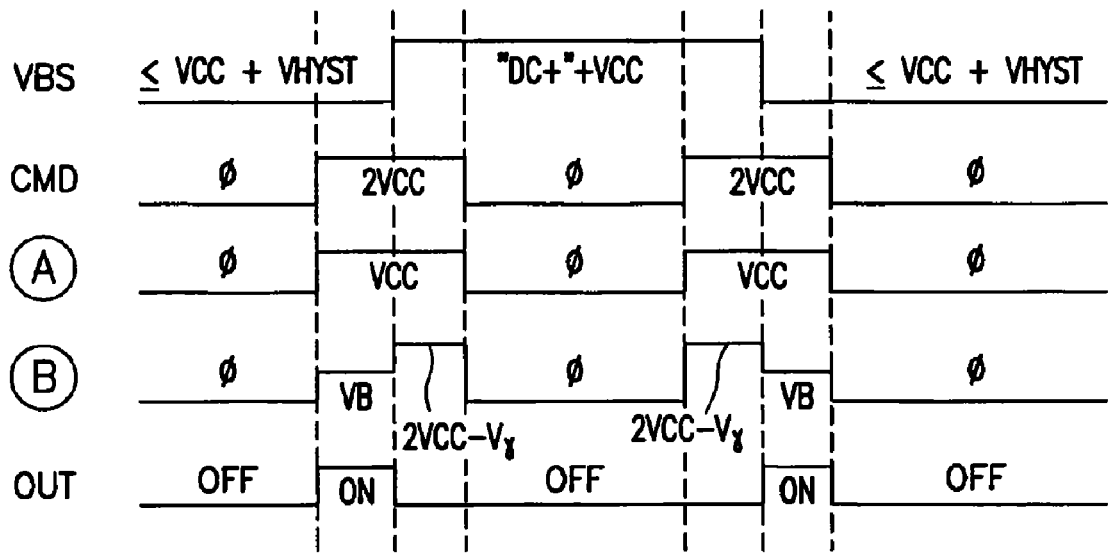
FIG. 11 is a graph indicating operational sequence of signals of components of the phase sense comparator circuit of FIG. 10 over time.

FIG. 11 illustrates timing signals of the components of the circuit 220. As illustrated, the high side floating supply voltage VBS represents the floating high side bootstrap voltage, a signal CMD is generated from signal LOPD, which, in turn, is generated form the low side input signal LIN and the gate control circuit. Signals A and B are voltages at points identified in FIG. 10 and a signal OUT represents the output to the gate control circuit for the bootstrap diode emulator 405 from the current comparator 230 with hysteresis.

When the signal LOPD is turned ON, the current comparator 230 is enabled and a first gate control circuit provides a signal used to turn on the "Vssense" LDMOS device 210. Then, as shown in FIG. 11, if VBS is ≦VCC+Vhysteresis, then the current comparator 230 enables the second gate control circuit to turn ON the diode emulator LDMOS 405 (VSsense OUT goes high). The diode emulator 405 stays turned ON until the signal LOPD is turned OFF, or until VBS becomes ≧VCC+Vhysteresis.

Figure 12:
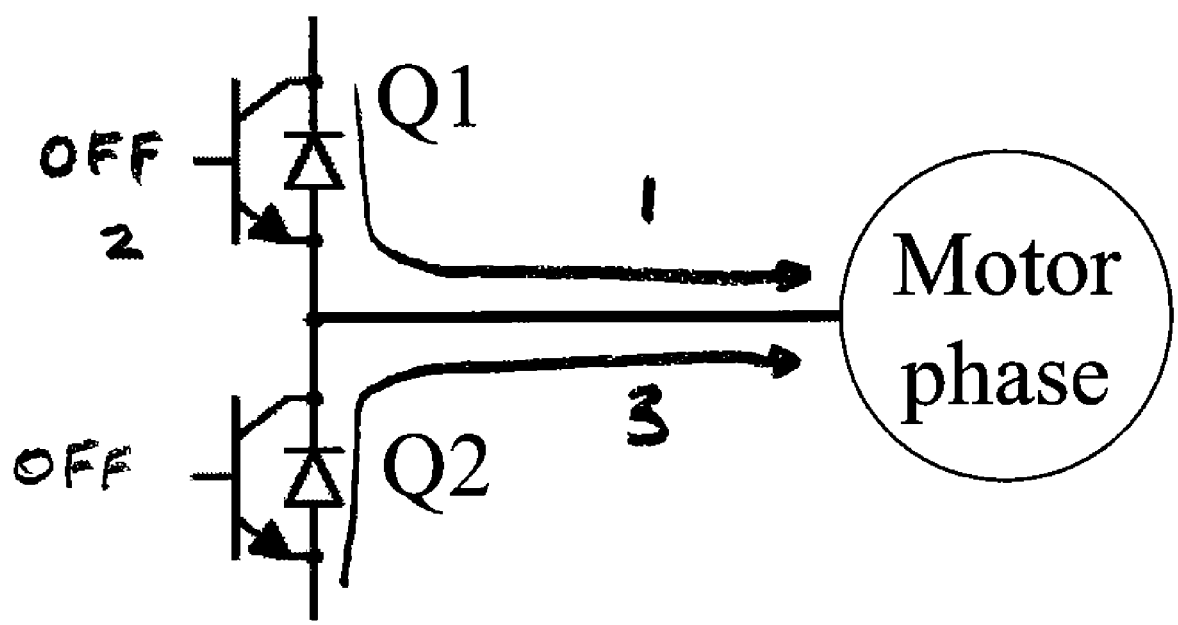
FIG. 12 is a diagram of two output transistors connected in a half bridge for driving a motor.

FIG. 12 shows two output transistors Q1 and Q2 connected in a half bridge stage for driving a phase of a load comprising a motor. When the high side input signal HIN is LOW, the phase sense comparator circuit 220 is enabled. When the high side input signal HIN is HIGH, the output transistors Q1 is enabled to allow the current to flow to the motor load, as identified in the Figure by numeral 1. Then, when the high side input signal HIN goes OFF, the output transistors Q1 is disabled, as identified in the Figure by numeral 2, and the time-out state is entered. When the output transistors Q1 is fully OFF, but before the low side transistor Q2 is turned ON, the current flows through the freewheeling diode to the motor, as identified in the Figure by numeral 3.

At that point, the high side input signal HIN is OFF; the low side input signal LIN is also OFF; and the phase sense comparator circuit 220 is enabled for one microsecond. During this time, the high side offset voltage VS is monitored.

If the switched node voltage VS is at a DC– level, the bootstrap diode emulator is turned ON. If the voltage VS is greater than VCC, the bootstrap diode emulator is turned OFF and the phase comparator circuit 220 is disabled.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An optimizing circuit for optimizing charging of a bootstrap capacitor connected to a high-side floating supply voltage at a first terminal and to a switched node voltage at a second terminal, the circuit for optimizing being included in a gate driver circuit having high-side and low-side driver circuits providing high-side and low-side input signals for driving high-side and low-side switches connected at a switched node in a half bridge to provide current to a load, the high-side driver circuit receiving a first control voltage referenced to a first level and a low-side driver circuit receiving a second control voltage referenced to a second level, the bootstrap capacitor providing a supply voltage for the high-side driver circuit, the optimizing circuit comprising:

a bootstrap diode emulator circuit comprising a first switch connected between the first terminal of the bootstrap capacitor and a supply voltage of the low-side driver circuit; and a phase sense comparator for sensing the voltage at the switched node and turning ON the first switch when the voltage at the switched node is LOW, whereby charging of the bootstrap capacitor is optimized when the phase sense comparator is enabled, the phase sense comparator being responsive to the high-side and low-side input signals, wherein when the high-side and low-side input signals are OFF, the phase sense comparator is enabled and the first switch is turned ON if the switched node voltage stays LOW or decreases to a DC− level and the phase sense comparator is disabled and the first switch is turned OFF if the switched node voltage stays HIGH or rises to a DC+ level.

2. The optimizing circuit of claim 1, wherein the bootstrap diode emulator circuit further comprises a dynamic back-gate biasing circuit connected to the bootstrap capacitor.

3. The optimizing circuit of claim 1, wherein the first switch has lower forward losses than a diode.

4. The optimizing circuit of claim 1, wherein the bootstrap diode emulator circuit further comprises a gate control circuit for driving the first switch; and a dynamic back-gate biasing circuit.

5. The optimizing circuit of claim 1, wherein the bootstrap diode emulator circuit comprises an emulator driver circuit connected to a control terminal of the first switch for controlling the first switch, wherein the phase sense comparator and the emulator driver circuit are connected between the low side supply voltage and a ground potential.

6. The optimizing circuit of claim 1, wherein the phase sense comparator receives an enabling signal generated by a low side output pre-driver from a low side input signal and provides an output signal VSsense out to the low side driver.

7. The optimizing circuit of claim 6, wherein the phase sense comparator is disabled when a high side input signal is HIGH and enabled when the low side input signal is HIGH, and the HIGH low side input signal forces an enabling signal for the phase sense comparator HIGH.

8. The optimizing circuit of claim 7, further comprising a time out circuit responsive to the high-side and low-side input signals, and wherein when the high-side and low-side input signals go OFF, a timeout is employed to keep the phase sense comparator enabled.

9. The optimizing circuit of claim 8, wherein the timeout is approximately one microsecond.

10. The optimizing circuit of claim 7, wherein the phase sense comparator remains enabled if at the end of the timeout the voltage VS is LOW and turns OFF if the voltage VS goes HIGH.

11. The optimizing circuit of claim 10, wherein the phase sense comparator provides a double enable for charging the bootstrap capacitor by turning ON the bootstrap diode emulator when the low side driver input is ON, and when the switched node voltage is LOW.

\* \* \* \* \*